United States Patent
Chetlur et al.

(10) Patent No.: US 6,535,014 B2
(45) Date of Patent: Mar. 18, 2003

(54) ELECTRICAL PARAMETER TESTER HAVING DECOUPLING MEANS

(75) Inventors: Sundar Srinivasan Chetlur, Singapore (SG); Pradip Kumar Roy, Orlando, FL (US)

(73) Assignee: Lucent Technologies, Inc., Murray Hill, NJ (US)

( * ) Notice: Subject to any disclaimer, the term of this patent is extended or adjusted under 35 U.S.C. 154(b) by 59 days.

(21) Appl. No.: 09/756,480

(22) Filed: Jan. 8, 2001

(65) Prior Publication Data

US 2002/0000824 A1 Jan. 3, 2002

Related U.S. Application Data

(60) Provisional application No. 60/176,882, filed on Jan. 19, 2000.

(51) Int. Cl.[7] ............................................... G01R 31/26
(52) U.S. Cl. ..................... 324/765; 324/763; 324/158.1
(58) Field of Search ............................... 324/765, 158.1, 324/73.1; 714/726, 733; 438/14, 18

(56) References Cited

U.S. PATENT DOCUMENTS 5,341,336 A   8/1994  McClure ..................... 365/201
5,381,373 A   1/1995  Ohsawa ...................... 365/201
6,133,746 A   10/2000 Fang et al. .................. 324/769

OTHER PUBLICATIONS

Snyder et al., *Novel–Self Stressing Test Structures for Realistic High–Frequency Reliability Characterization*, 1993 IEEE/IRPS, p. 57–65. (Month Unavailable).

*Primary Examiner*—Vinh P. Nguyen

(57) ABSTRACT

A tester for a circuit path includes a voltage controlled oscillator (VCO) for generating a controllable frequency oscillating test signal and having a controllable amplitude defined between first and second voltages, a multiplexer for selectively connecting one of the oscillating test signal, the first voltage, and the second voltage to the circuit path, and a selector for selectively connecting the multiplexer to the circuit path. Moreover, at least one of the first and second voltages may be controllable so that the VCO generates the oscillating test signal to selectively have one of an amplitude greater than, less than, and equal to an amplitude of an output of the circuit path. The circuit path may include a plurality of electronic circuit devices connected together.

17 Claims, 3 Drawing Sheets

ELECTRICAL PARAMETER TESTER HAVING DECOUPLING MEANS

RELATED APPLICATION

The present application is based upon co-pending provisional application Serial. No. 60/176,882 filed Jan. 19, 2000, which is hereby incorporated herein in its entirety by reference.

FIELD OF THE INVENTION

The present invention relates to the field of electronic circuits, and, more particularly, to a tester and method for testing electrical parameters of circuit paths including at least one electronic circuit device.

BACKGROUND OF THE INVENTION

Integrated circuits (ICs) are well known and are used in a variety of telecommunications, computer, and other electronic devices. It is important to detect defects and/or design limitations of such integrated circuits during their design and testing phase. This is so that these problems may be corrected before large scale manufacturing takes place. Furthermore, is may also be important to monitor electrical properties or parameters of such ICs over their lifetime to detect problems that may arise in certain applications so that these problems may be corrected in future designs.

One method for testing ICs for latent defects or other problems is stress testing. Stress testing involves applying a stress voltage to an integrated circuit and measuring the effects that the stress voltage has on certain electrical parameters. For example, the stress voltage may be used to accelerate degradation of semiconductor device layers due to hot carrier injection. The effects of such hot carrier degradation or aging may then be determined using parametric analyzers or other measurement devices, as will be appreciated by those of skill in the art.

One example of a stress tester is disclosed in an article entitled "Novel Self-Stressing Test Structures for Realistic High-Frequency Reliability Characterization" by Snyder et al., 1993 IEEE Intl. Reliability Physics Symposium Proceedings, pp. 57–65. The article discloses a self-stressing test structure that may be used for reliability failure measurements caused by hot carriers, electromigration, and oxide breakdown, for example. The test structure includes a high-frequency on-chip oscillator having a frequency controlled by an external DC voltage. A high frequency, oscillating (i.e., an alternating current (AC)) test signal is produced thereby and may be routed to various circuit elements. The test signal may be electronically isolated to allow DC measurement of the various circuit elements.

While the above AC self-stressing test structure may be useful for determining the effects of high frequency operation on an integrated circuit, other factors may also effect electrical parameters. For example, overshoots or undershoots of an input voltage to a circuit may also cause hot carrier injection or other problems independent of operating frequencies. Additionally, it may be desirable to measure the effects of voltage overshoots or undershoots, for example, over a circuit path including a plurality of circuit devices rather than on a single device.

SUMMARY OF THE INVENTION

In view of the foregoing background, it is therefore an object of the invention to provide a tester and related methods for testing a circuit path which tests not only the effects of high frequency operation but also the effects of voltage overshoots and undershoots.

This and other objects, features, and advantages in accordance with the present invention are provided by a tester for a circuit path including a voltage controlled oscillator (VCO) for generating a controllable frequency oscillating test signal and having a controllable amplitude defined between first and second voltages, a multiplexer for selectively connecting one of the oscillating test signal, the first voltage, and the second voltage to the circuit path, and a selector for selectively connecting the multiplexer to the circuit path. Moreover, at least one of the first and second voltages may be controllable so that the VCO generates the oscillating test signal to selectively have one of an amplitude greater than, less than, and equal to an amplitude of an output of the circuit path. The circuit path may include a plurality of electronic circuit devices connected together.

More particularly, the circuit path, the VCO, the multiplexer, and the selector may be integrated on a circuit chip. Additionally, the VCO, the multiplexer, and the selector may be fabricated using complementary metal oxide semiconductor (CMOS) components. The plurality of electronic circuit devices may be at least one of analog circuit devices, digital circuit devices, and mixed signal devices. Furthermore, the VCO may control the frequency of the oscillating test signal based upon one of the first and second voltages.

A method for testing a circuit path according to the invention includes generating first and second voltages, generating a controllable frequency oscillating test signal having a controllable amplitude defined between the first and second voltages using a voltage controlled oscillator (VCO), and selectively connecting one of the oscillating test signal, the first voltage, and the second voltage to the circuit path. At least one of the first and second voltages may be controlled so that the VCO generates the oscillating test signal to selectively have one of an amplitude greater than, less than, and equal to an amplitude of an output of the circuit path. Also, the circuit path may include a plurality of electronic circuit devices connected together.

Moreover, the method may also include measuring at least one electrical parameter of the circuit path. Measuring may include measuring the at least one parameter using a parametric analyzer. Additionally, the at least one electrical parameter may include at least one of transconductance, maximum current drive, and threshold voltage. The method may also include disconnecting the oscillating test signal, the first voltage, and the second voltage from the circuit path prior to measuring. Furthermore, the method may include controlling the frequency of the oscillating test signal based upon one of the first and second voltages.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
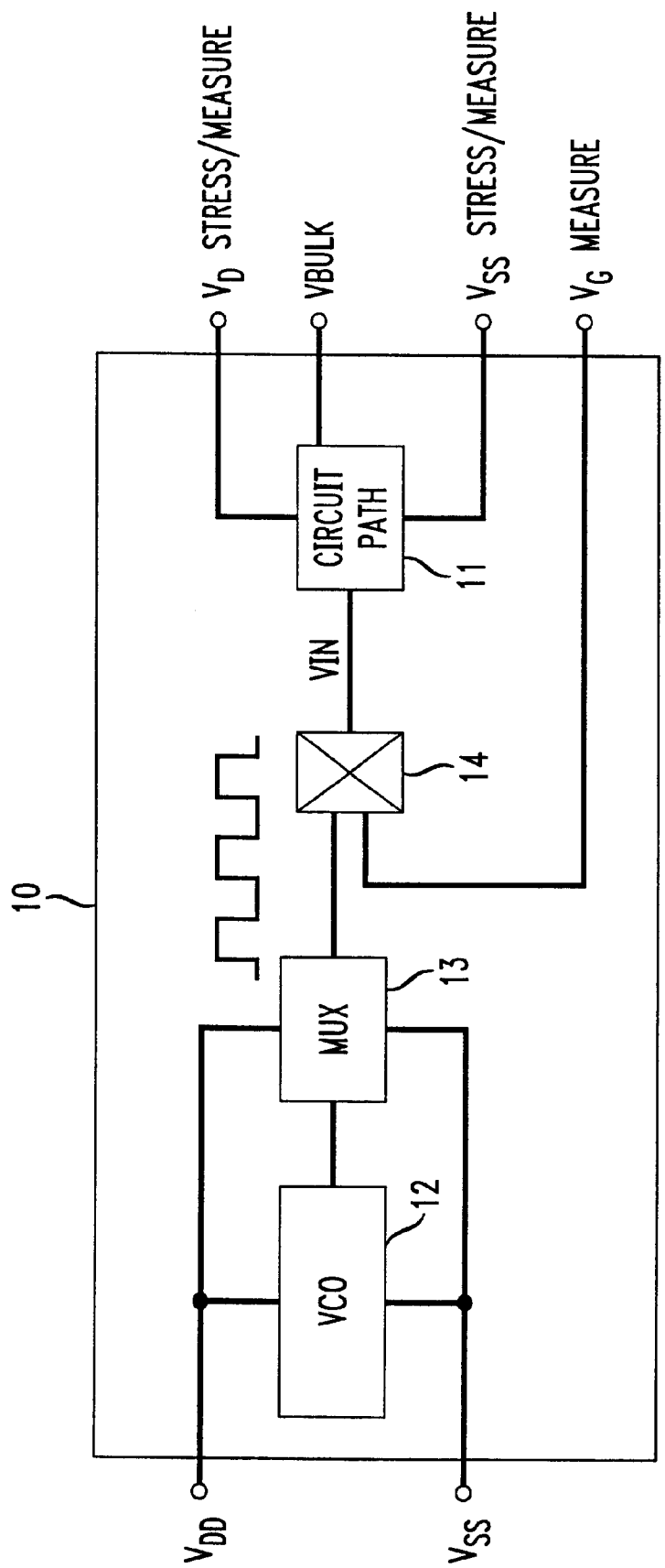
FIG. 1 is a schematic block diagram of a tester for a circuit path according to the present invention.

Referring now to the schematic block diagram of FIG. 1, an integrated circuit (or circuit chip) 10 including a tester according to the present invention for testing a circuit path 11 of the integrated circuit is now described. The tester includes a voltage controlled oscillator (VCO) 12 for generating a controllable frequency oscillating test signal. The oscillating test signal has a controllable amplitude defined between first and second voltages $V_{DD}$, $V_{SS}$.

At least one of the first and second voltages $V_{DD}$, $V_{SS}$ may be controllable so that the VCO 12 generates the oscillating test signal to selectively have one of an amplitude greater than, less than, and equal to an amplitude of an output VBULK of the circuit path 11. Making the amplitude of the oscillating test signal greater than the output VBULK of the circuit path 11 provides a voltage overshoot thereto during a stressing portion of the testing.

Likewise, making the amplitude of the oscillating test signal less than the output of the circuit patch provides a voltage undershoot thereto. Furthermore, the VCO 12 also controls the frequency of the oscillating test signal based upon one of the first and second voltages $V_{DD}$, $V_{SS}$. As such, the circuit path 11 may be stressed using voltage overshoots and undershoots with or without frequency variations according to the present invention.

The tester may further include a multiplexer 13 for selectively connecting one of the oscillating test signal, the first voltage $V_{DD}$, and the second voltage $V_{SS}$ to the circuit path 11. The multiplexer 13 thereby allows predetermined testing patterns to be applied to the circuit path 11 using the oscillating test signal, the first voltage $V_{DD}$, and the second voltage $V_{SS}$, as will be appreciated by those of skill in the art. A selector 14 selectively connects the multiplexer 13 to the circuit path 11 so that the circuit path 11 may be decoupled after the stressing has taken place. This allows various electrical parameters to be measured, as will be discussed further below.

The selector 14 may provide the selective connection responsive to an external signal $V_G$ MEASURE, for example. That is, the testing patterns are applied to the circuit path 11 during stressing thereof and decoupled therefrom during measurement of the electrical parameters responsive to the signal $V_G$ MEASURE. The circuit path 11 is supplied with a stress voltage $V_D$ and the second voltage $V_{SS}$ during the stressing and measurement, which will be discussed further below.

The circuit path 11, the VCO 12, the multiplexer 13, and the selector 14 may be integrated on the circuit chip 10, as schematically illustrated in FIG. 1. The VCO 12, the multiplexer 13, and the selector 14 may be fabricated using complementary metal oxide semiconductor (CMOS) components, for example, as will be discussed further below. Also, those of skill in the art will appreciate that the tester of the present invention may be used with electronic circuit devices such as analog circuit devices, digital circuit devices, and/or mixed signal devices. The circuit path 11 may include a single electronic circuit device or a plurality of such devices connected together.

A method for testing the circuit path 11 according to the invention includes generating the first and second voltages $V_{DD}$, $V_{SS}$, generating the oscillating test signal having a controllable amplitude defined between the first and second voltages using the VCO 12, and selectively connecting one of the oscillating test signal, the first voltage $V_{DD}$, and the second voltage $V_{SS}$ to the circuit path. At least one of the first and second voltages $V_{DD}$, $V_{SS}$ may be controlled so that the VCO 12 generates the oscillating test signal to selectively have one of an amplitude greater than, less than, and equal to the amplitude of the output of the circuit path 11.

Moreover, the method may also include measuring at least one electrical parameter of the circuit path. Measuring may include measuring the at least one electrical parameter using a parametric analyzer (not shown). Additionally, the at least one electrical parameter may include at least one of transconductance ($g_m$), maximum current drive ($I_{dsat}$), and threshold voltage ($V_t$). The method may also include disconnecting the oscillating test signal, the first voltage $V_{DD}$, and the second voltage $V_{SS}$ from the circuit path 11 prior to measuring the at least one electrical parameter, as described above.

The following example is provided to further illustrate stressing of the circuit path 11 and measurement of the above described electrical parameters according to the invention.

EXAMPLE

In this example, the effect of input voltage swing on device aging in an inverter (hereafter "device under test" or "DUT") was measured, and the results are compared to those of individual transistors. The use of a circuit path 11 having a single circuit element (i.e., the DUT) provides for ease of illustration of the present invention. Of course, those of skill in the art will appreciate that the present invention may easily be extended to study the aging behavior of devices in other configurations by replacing the DUT with a circuit path including a plurality of electronic circuit devices.

The amplitude of the oscillating test signal during stressing was varied over a voltage range from −2 to +2 V. Of course, a larger voltage range may also be used according to the present invention. This variable amplitude allows the effects of clock undershoot and overshoot to be quantitatively estimated on device aging at the gate level. The VCO 12 used was a voltage-controlled ring oscillator which generated the oscillating test signal over a frequency range of 15–400 MHZ.

The DUT used was a single stage inverter and was stressed in a frequency range of about 25–30 MHZ. Channel metal oxide semiconductor (NMOS) transistor parameters, such as transconductance ($g_m$), maximum current drive ($I_{dsat}$), and threshold voltage ($V_t$), were measured by an external parametric analyzer, as will be understood by those of skill in the art. A twin-tub, dual poly-silicon (n+ and p+) gate, 0.18 CMOS technology with a 42 Å thick gate oxide was used to fabricate the stressing test circuit (i.e., the VCO 12, multiplexer 13, and selector 14) described above.

Figure 2:
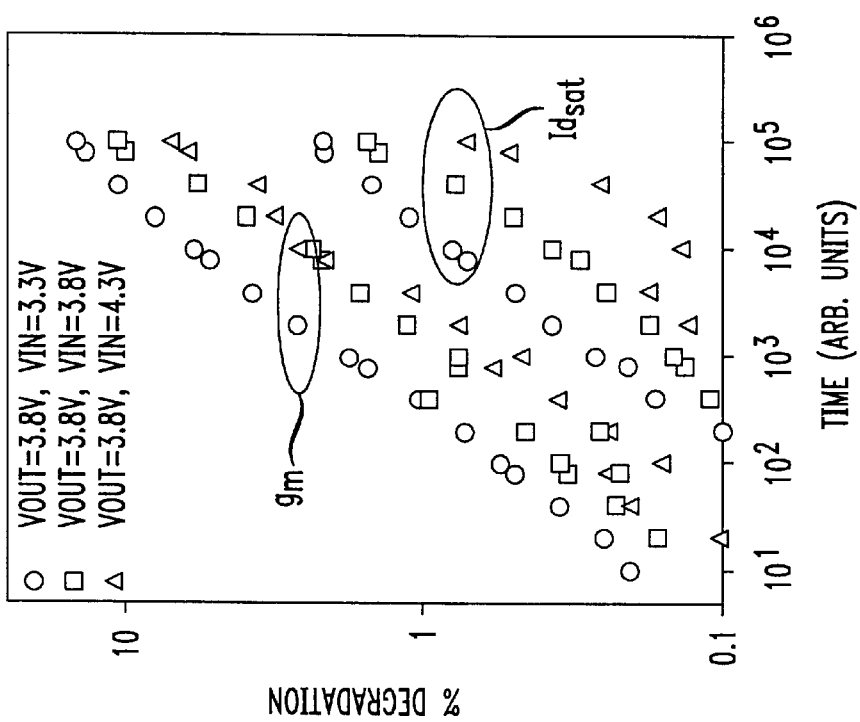
FIGS. 2–4 are graphs illustrating transconductance ($g_m$) and maximum current drive ($I_{dsat}$) degradation over time for a circuit path tested according to the present invention under various operating conditions.

The effects of applying a constant gate stress voltage and frequency while varying the stress voltage applied to the DUT are shown in FIG. 2. The variation of transconductance ($g_m$) was monitored as a function of stress time. For a constant ring oscillator frequency, the rise and fall transitions are fixed and aging occurs over the same time period for each stress voltage. It is known that pulsed DC aging behavior of individual NMOS transistors varies with bias conditions, and degradation is faster when the gate voltage swing is below the source-drain stress voltage. See, e.g., Snyder et al., noted above. Faster aging is attributed to increased hot carrier aging at lower gate-source voltages ($V_{GS}$). A similar behavior was observed in the present example. At large $V_{DD}$/VBULK values, higher electric fields at the drain edge significantly accelerated hot carrier aging of the NMOS device and led to faster $g_m$ degradation.

The input frequency was also varied by changing the first supply voltage $V_{DD}$. The total aging time ($T_{AC}$) is expressed as:

$$T_{AC} = f^* t_{\textit{eff}} \quad (1)$$

$T_{AC}$ increases at higher frequencies (f), i.e., at a higher first voltage $V_{DD}$. The parameter $t_{\textit{eff}}$ is the effective aging time during a clock cycle. The frequency of an n-stage ring oscillator circuit is defined by:

$$f = \frac{1}{2*n*(t_r + t_f)} \quad (2)$$

and depends on the rise ($t_r$) and fall ($t_f$) times of the inverters, for example, that make up the oscillator. At higher $V_{DD}$ values, the charging/discharging current increases and the inverters switch more rapidly, leading to faster oscillating test signal frequencies. Since hot carrier aging occurs mostly during the rise and fall transitions, the effective aging time $t_{\textit{eff}}$ will decrease with faster switching times.

Figure 3:
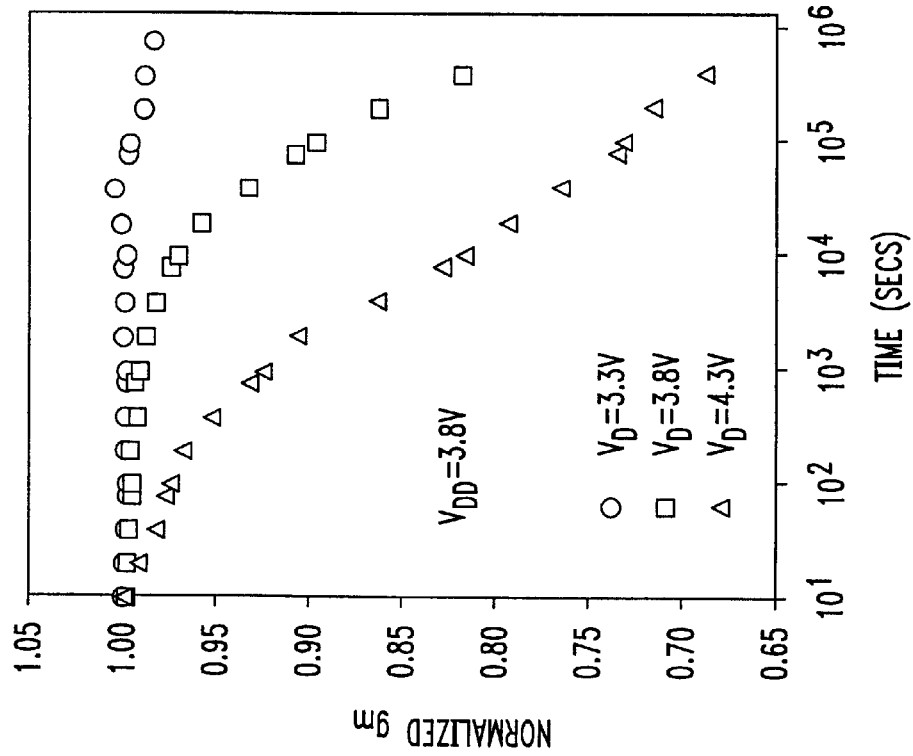
Figure 5:
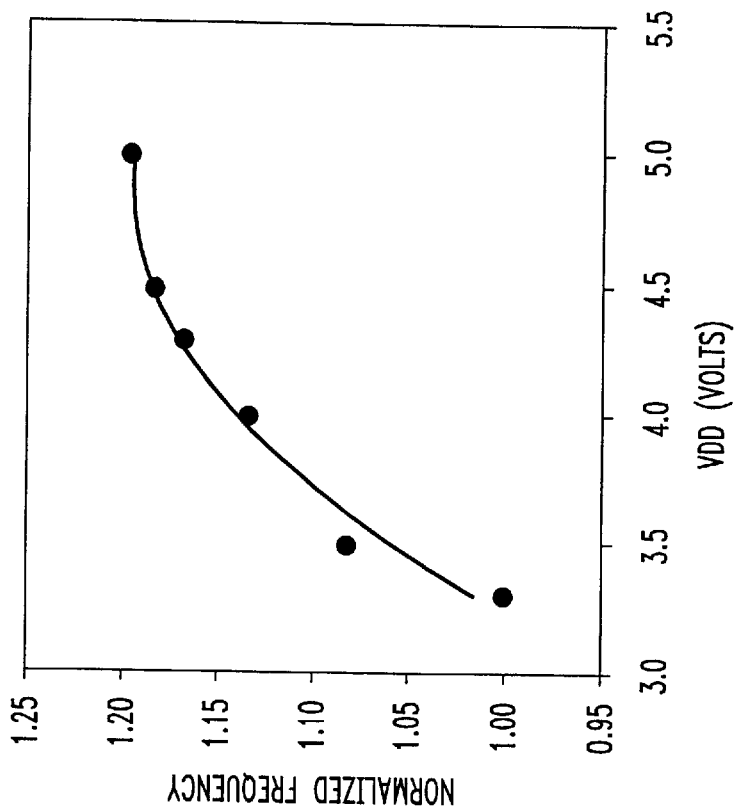
FIG. 5 is a graph illustrating variations in the controllable frequency oscillating test signal of the present invention with voltage.
Figure 4:
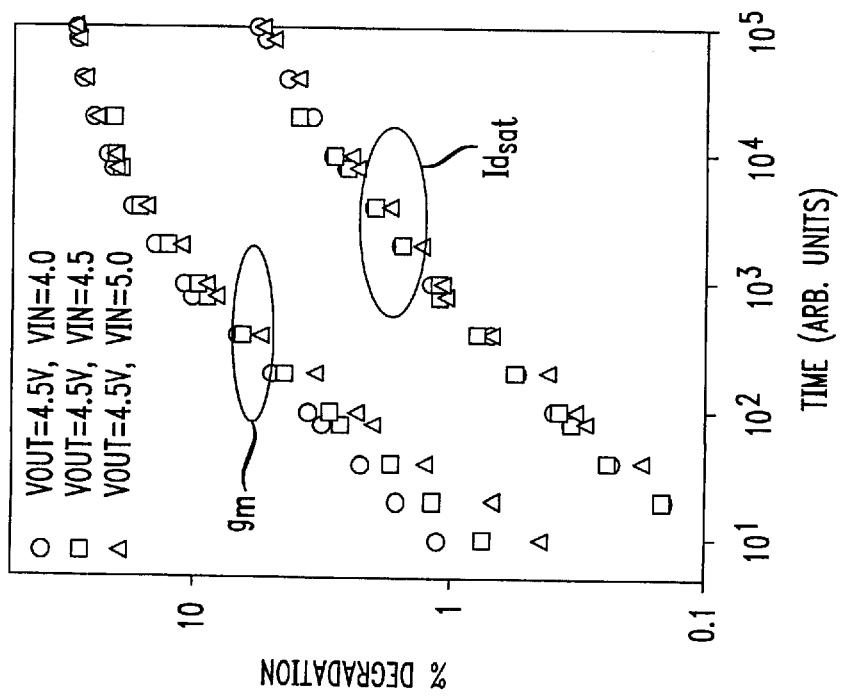

Turning now to FIGS. 3 and 4, results obtained using the tester of the present invention for two different bias and input conditions will now be discussed. The input voltage VIN swing to the DUT was varied between ±0.5 V relative to the output voltage VBULK swing for these examples. Interestingly, a strong input dependence for low values of VBULK (<4.0) was observed, as shown in FIG. 2. NMOS aging is more pronounced for smaller values of VIN, i.e., lower stress frequencies. In contrast, for large values of VBULK (>4.0 V) the aging characteristics are identical irrespective of the input voltage VIN swing, as shown in FIG. 4.

For a constant input frequency, $t_{\textit{eff}}$ is invariant and aging is accelerated at higher values of the stress voltage $V_D$ due to increased hot carrier aging. However, if input swing is modified by changing $V_{DD}$, both the ring oscillator frequency and $t_{\textit{eff}}$ are altered and there is some inconsistency in the results between the low and high $V_D$/VBULK values, as seen in FIGS. 3 and 4. The reason for this discrepancy is explained below. Ring oscillator frequency improves by 18% with supply voltage ($V_{DD}$), i.e., up to 4.5 V, as illustrated in FIG. 6. When VD equals 3.8 V, higher $V_{DD}$ values increase the input frequency, and faster aging is expected according to equation (1). However, $t_{\textit{eff}}$ decreases at higher frequencies, as defined by equation (2), and thus dictates the hot carrier aging process. This leads to lower degradation at high $V_{DD}$/VIN values. At smaller $V_{DD}$ values, $t_{\textit{eff}}$ increases and accelerates aging.

For a large $V_D$ of 4.5 V, the ring oscillator frequency and $t_{\textit{eff}}$ tends to saturate for all values of $V_{DD}$ between 4.0–5.0 V, and aging becomes independent of VIN for a constant $V_D$. These results suggest that if rise and fall times of the input signal are not altered, voltage over/under shoots of ±0.5 V in input clock signals do not significantly change the aging characteristics of NMOS devices in circuits. Such conditions occur when the input clock feeds through the gate-drain capacitance during circuit operation. For cases when the input rise/fall times are altered, e.g., voltage overshoot due to interconnect cross-capacitance, device aging will be determined by changes to the effective aging time $t_{\textit{eff}}$.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. An integrated circuit comprising:
    a circuit path comprising at least one electronic circuit device;
    a tester comprising:
        a voltage controlled oscillator (VCO) for generating a controllable frequency oscillating test signal and having a controllable amplitude defined between first and second voltages, at least one of the first and second voltages being controllable so that said VCO generates the oscillating test signal to selectively have one of an amplitude greater than, less than, and equal to an amplitude of an output of the circuit path;
        a multiplexer for selectively connecting one of the oscillating test signal, the first voltage, and the second voltage to the circuit path; and
        a selector for selectively connecting said multiplexer to the circuit path.

2. The integrated circuit of claim 1 wherein said VCO, said multiplexer, and said selector are fabricated using complementary metal oxide semiconductor (CMOS) components.

3. The integrated circuit of claim 1 wherein said circuit path comprises a plurality of electronic circuit devices connected together.

4. The integrated circuit of claim 1 wherein said at least one electronic circuit device comprises at least one of an analog circuit device, a digital circuit device, and a mixed signal device.

5. The integrated circuit of claim 1 wherein said VCO controls the frequency of the oscillating test signal based upon one of the first and second voltages.

6. A method for testing a circuit path comprising a plurality of electronic circuit devices connected together, the method comprising:
    generating first and second voltages;
    generating a controllable frequency oscillating test signal having a controllable amplitude defined between the first and second voltages using a voltage controlled oscillator (VCO);
    controlling at least one of the first and second voltages so that the VCO generates the oscillating test signal to selectively have one of an amplitude greater than, less than, and equal to an amplitude of an output of the circuit path;
    controlling the frequency of the oscillating test signal based upon one of the first and second voltages; and
    selectively connecting one of the oscillating test signal, the first voltage, and the second voltage to the circuit path.

7. The method of claim 6 further comprising measuring at least one electrical parameter of the circuit path.

8. The method of claim 7 wherein measuring comprises measuring the at least one parameter using a parametric analyzer.

9. The method of claim 7 wherein the at least one electrical parameter comprises at least one of transconductance, maximum current drive, and threshold voltage.

10. The method of claim 7 further comprising disconnecting the oscillating test signal, the first voltage, and the second voltage from the circuit path prior to measuring.

11. A method for testing a circuit path comprising at least one electronic circuit device, the method comprising:

generating first and second voltages;

generating a controllable frequency oscillating test signal having a controllable amplitude defined between the first and second voltages using a voltage controlled oscillator (VCO);

controlling at least one of the first and second voltages so that the VCO generates the oscillating test signal to selectively have one of an amplitude greater than, less than, and equal to an amplitude of an output of the circuit path; and selectively connecting one of the oscillating test signal, the first voltage, and the second voltage to the circuit path.

12. The method of claim 11 further comprising measuring at least one electrical parameter of the circuit path.

13. The method of claim 12 further comprising disconnecting the oscillating test signal, the first voltage, and the second voltage from the circuit path prior to measuring.

14. The method of claim 12 wherein measuring comprises measuring the at least one parameter using a parametric analyzer.

15. The method of claim 12 wherein the at least one electrical parameter comprises at least one of transconductance, maximum current drive, and threshold voltage.

16. The method of claim 11 further comprising controlling the frequency of the oscillating test signal based upon one of the first and second voltages.

17. The method of claim 11 wherein the at least one electronic circuit device comprises a plurality of electronic circuit devices connected together.

* * * * *